United States Patent [19]

Belenkov et al.

[11] 4,109,274
[45] Aug. 22, 1978

[54] SEMICONDUCTOR SWITCHING DEVICE WITH BREAKDOWN DIODE FORMED IN THE BOTTOM OF A RECESS

[76] Inventors: Nikolai Mikhailovich Belenkov, Teply stan, mikroraion 6, korpus 93, kv. 236; Anatoly Ivanovich Kurnosov, prospekt Mira, 190a, kv. 20; Evgeny Efremovich Malitsky, ulitsa Begovaya, 15, kv. 9, all of Moscow, U.S.S.R.

[21] Appl. No.: 647,360

[22] Filed: Jan. 8, 1976

[51] Int. Cl.² .................. H01L 29/74; H01L 29/06
[52] U.S. Cl. ............................... 357/38; 357/13; 357/39; 357/55; 357/67; 357/86; 357/89
[58] Field of Search .................. 357/51, 37, 38, 39, 357/13, 89, 86, 55, 67

[56] References Cited

U.S. PATENT DOCUMENTS

| 3,146,135 | 8/1964 | Sah .................................. 357/89 |
| 3,307,049 | 2/1967 | Bernuth et al. ................... 357/38 |
| 3,408,545 | 10/1968 | Dececco et al. .................. 357/38 |
| 3,622,845 | 11/1971 | McIntyre et al. ................. 357/38 |
| 3,682,708 | 8/1972 | Bennett ............................ 357/55 |
| 3,913,213 | 10/1975 | Mills et al. ....................... 357/46 |

FOREIGN PATENT DOCUMENTS

| 627,566 | 7/1963 | Belgium ..................................... 357/55 |
| 43-15736 | 7/1968 | Japan ......................................... 357/55 |
| 753,133 | 7/1953 | United Kingdom ...................... 357/55 |
| 380,222 | 2/1973 | U.S.S.R. .................................... 357/55 |
| 405,473 | 8/1973 | U.S.S.R. .................................... 357/55 |

Primary Examiner—Joseph E. Clawson, Jr.
Attorney, Agent, or Firm—Lackenbach, Lilling, and Siegel

[57] ABSTRACT

A semiconductor switching device according to the invention has a semiconductor crystal comprising sequentially alternate layers of opposite conductivity type. The device comprises two emitters of different conductivity type, at least one gate base, another base of opposite conductivity type with respect to the first base adjacent to the gate base, and an additional region of conductivity type opposite to the gate base which is adjacent to the surface of the gate base and arranged completely or partially in the gate base. At a point where the additional region extends onto the surface, there is provided a recess the bottom area of which exceeds that of the exposed part of the additional area, so that this part is disposed within the bottom area of the recess without contacting the lateral walls of the recess.

4 Claims, 11 Drawing Figures

SEMICONDUCTOR SWITCHING DEVICE WITH BREAKDOWN DIODE FORMED IN THE BOTTOM OF A RECESS

The present invention relates to switching devices having to stable states in the voltage-current characteristics: a low conductivity state — a cut-off state, and a high conductivity state, and a high conductivity state — a conducting states, and, more particularly, to semiconductor switching devices having a fixed value of switching voltage.

Known in the art is a semiconductor switching device having a fixed value of switching voltage, embodied as a multilayer semiconductor structure comprising alternate layers of opposite conductivity type, this structure forming a thyristor having laterally arranged active layers, comprising two emitters of opposite conductivity type, at least one gate base, a base adjacent to said gate base and having conductivity type opposite to said gate base, and an additional region of conductivity type opposite to said gate base which is adjacent to the surface of said gate base and which is disposed completely or partially in this gate base.

The central p-n junction of this thyristor formed by the bases thereof is shunted by a low-voltage zener diode p-n junction formed by the gate base of the device and by a local diffusion additional region disposed on the surface part where the central p-n junction emerges on the surface. The switching voltage as well as the technological reproducibility and stability within the assigned range of temperature of the device depend on the value of breakdown voltage of said low voltage p-n junction.

The switching voltage of such semiconductor switching devices, having an additional region provided near the surface part where the central p-n junction emerges on the surface, is 6 to 12 volts. The range of switching voltage is defined by design features. It has been known that the electrical parameters of multilayer switching structures depend on the electrophysical characteristic of separate layers. Thus in particular, the value of switching voltage is defined basically by a ratio of impurity concentrations in semiconductor layers of opposite conductivity type forming the low-voltage p-n junction which shunts the central p-n junction of the structure; i.e., by a ratio of the surface concentrations of the impurity in the additional region and that of the control base. The object of embodiment of a switching structure having satisfactory electrical parameters can be achieved provided the impurity concentration on the surface of the control base is within the range of $10^{17}$ - $10^{18}$ cm$^{-3}$ whereas the impurity concentration on the surface of the additional region which is usually formed during formation of an emmiter layer of the same conductivity type, is not less than $5.10^{18}$ cm$^{-3}$. Such a ratio of impurity concentrations in the above regions provides for embodiment of semiconductor switching devices having switching voltage within the range of 6 to 12 volts.

The value of the switching voltage of a semiconductor switching device can be increased by reducing the impurity concentration on the surface of the gate base. However, the latter causes a general reduction in the switching voltage of the four-layer structure owing to the fact that the depleted region of the central p-n junction extends into the emitter p-n junction. Besides, the task of obtaining a sufficiently low value of impurity surface concentration involves difficulties of technological nature.

The object of the invention is to provide a structure of a semiconductor switching device which ensures an expansion of the range of operating voltages by at least one order of magnitude, i.e., an increase of the values of the switching voltage.

Another object of the invention is to reduce temperature sensitivity of the switching voltages of the device, i.e., to reduce the temperature coefficient of the switching voltage.

These and other objects are attained in a semiconductor switching device, embodied on the basis of a semiconductor crystal having sequentially alternate layers of opposite conductivity type, comprising: two emitters of opposite conductivity type, at least one gate base, another base being adjacent to said gate base and having conductivity type opposite to said control base, and an additional region of conductivity type opposite to said gate base, which is adjacent to the surface of the control base and arranged completely or partially in this gate base, wherein according to the invention, at a point where this additional region extends to the surface there is provided a recess, the bottom area of which exceeds that of the exposed part of the additional region, so that this part is contained within the bottom area without contacting this part and the lateral walls of said recess.

To improve reliability of the semiconductor switching device it is preferable to arrange a part of the additional region in the base which is adjacent to the gate base, provided the impurity concentration on the surface of the additional region does not exceed the value of impurity concentration in the base having the same conductivity type.

To expand the range of operating voltages, it is preferable that another recess within the bottom area of the first recess arranged in the additional region be provided so that the lateral walls of the second recess have no contact with the boundaries of the additional region.

With the purpose of improving the reliability of the semiconductor switching device and expanding the range of operating voltages thereof, it is preferable that the p-n junction formed by its bases to under the additional region be enlarged.

To control the value of the switching voltage temperature coefficient it is preferable to provide for a second additional region which has the same conductivity type as that of the gate base, is adjacent to an emitter arranged in this base, and is disposed on the surface of this gate base, the impurity concentration of this additional region being higher than that of the gate base by at least one order of magnitude.

To control the value of the switching voltage temperature coefficient, it is preferable that provision be made for a local layer of a conducting material between the emitter and the additional region on the surface of the gate base.

To control the value of the switching voltage temperature coefficient, it is preferable to manufacture said conducting layer from a material having a negative temperature coefficient of resistance.

The main advantage of the semiconductor switching device embodied according to the invention is a substantial expansion of the range of operating voltage thereof and an improvement of the temperature coefficient of switching voltage.

The semiconductor switching device according to the invention features high reliability, is simple in design and easy to manufacture does not require development or application of special equipment or production processes, and can be manufactured on the basis of well-developed and mastered production processes.

Other objects and advantages of the invention will become evident from consideration of the following detailed description of specific embodiments thereof and accompanying drawings, wherein.

Figure 1:
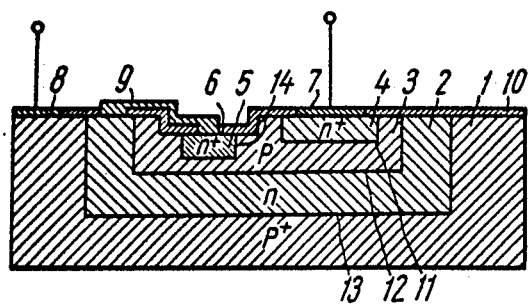
FIG. 1 represents the structure, in a longitudinal section, of a semiconductor switching device having a recess arranged at a point where an additional region extends onto the surface.

The structure of a semiconductor switching device schematically presented in FIG. 1 comprises the following four alternate layers of opposite conductivity type: a p-type emitter 1, an n-type wide base 2 adjacent to this emitter 1, a p-type gate base 3, and an n-type emitter 4 arranged therein. The gate base 3 is provided with a recess 6 which is disposed at a point where an additional region 5 of n-type conductivity extends onto the surface. Metal electrodes 7 and 8 are connected to the emitters 1 and 4 of the device, whereas electrical connection between the additional region 5 and the wide base 2 is provided by a current-conducting path 9. The surface of the semiconductor switching device is coated with a passivating layer 10.

The control base 3 and the n-type emitter 4 are arranged to form a p-n junction 11. A central p-n junction 12 of the four-layer structure is formed by its bases 3 and 2, whereas an emitter p-n junction 13 is formed by the emitter 1 and the n-type wide base 2. The additional region 5 and the gate base 3 form a p-n junction 14.

Figure 2:
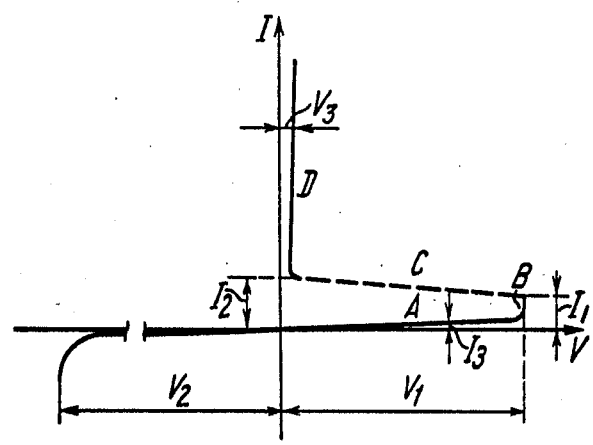
FIG. 2 is the voltage-current characteristic of the semiconductor switching device of FIG. 1.

FIG. 2 shows a voltage-current characteristic I = F (V) of the semiconductor switching device shown in FIG. 1, the X-axis representing voltages V, and the Y-axis, current I. The symbols of the electrical parameters in the voltage-current characteristic are as follows:

$I_1$ — switching-on current of the semiconductor switching device, i.e. the maximum value of the current flowing through the device in a cut-off state, at which current said device becomes conducting;

$I_2$ — holding current of the semiconductor switching device, i.e. the minimum value of forward current flowing through the conducting device;

$I_3$ — leakage current of the semiconductor switching device, i.e. current flowing through the device in a cut-off state, at a certain forward voltage.

$V_1$ — switching voltage of the semiconductor switching device, i.e., the maximum voltage of the cut-off device at which said device becomes conducting;

$V_2$ — inverse breakdown voltage, i.e., the value of reverse voltage at which increasing avalanche current is flowing through the device;

$V_3$ — residual voltage, i.e. the device voltage drop at a defined value of forward current with the device in a conducting state.

Figure 3:
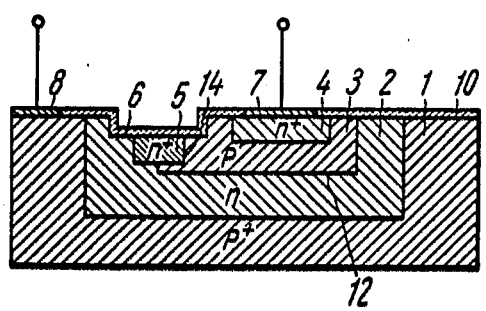
FIG. 3 is similar to FIG. 1 and represents the structure of a semiconductor switching device having an additional region provided at a point where the p-n junction formed by the bases of the device extends onto the surface.

The symbols of the voltage-current characteristic regions are as follows:

A — non-conductance state region,
B — switching region,
C — negative impedance region
D — conducting state region FIG. 3 is a schematic representation of a structure of the semiconductor switching device having, as distinct from the semiconductor switching device shown in FIG. 1, a part of the additional region 5 and a part of the recess 6 disposed on the surface portion where the central p-n junction 12 formed by the gate base 3 and the wide base 2 emerges on the surface, the wide base 2 being adjacent to the gate base 3. The impurity concentration on the surface of the additional n-type region 5 is higher than that of the wide base of the same conductivity type. Owing to said arrangement of the layers of the device and of the recess 6, a current-conducting connecting path is not required.

Figure 4:
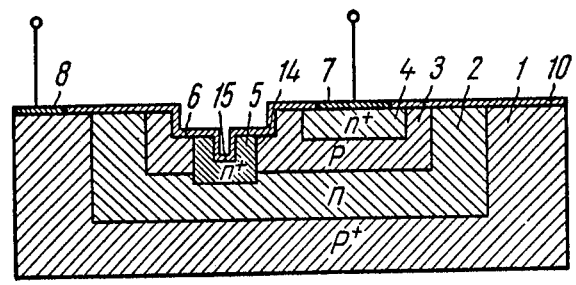
FIG. 4 is similar to FIGS. 1 and 3, and represents the structure of a semiconductor switching device having an additional recess.

A semiconductor switching device having low values of switching voltages can be provided on the basis of a structure shown in FIG. 4, which has, as distinct from the structure of the semiconductor switching device of FIG. 1, a second recess 15 arranged within the recess 5 so that the lateral walls of the recess 15 do not contact the boundaries of the additional region 5.

In this case, the recess 15 should be deep enough to provide for the additional region 5 to extend into the wide base 2 of n conductivity type.

Figure 5:
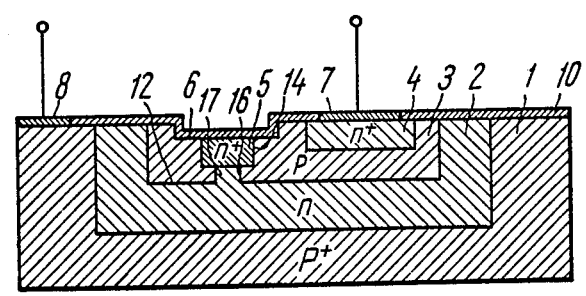
FIG. 5 is similar to FIGS. 1 and 3–4 and shows the structure of a semiconductor switching device with the p-n junction formed by the bases of the device extending to under the additional region.

The structure of the semiconductor switching device shown in FIG. 5 provides a bases for an embodiment of the device having a wide range of switching voltages. In the device according to said alternative embodiment thereof, the p-n junction 12 formed by the gate base 3 and the wide base 2 of n conductivity type extends locally to under the additional region 5 through an extension 16 so that this extension 16 forms a jumper 17 providing electrical connection between the additional region 5 and the wide base 2 of n conductivity type.

The passivation of the p-n junction 14 formed by the additional region 5 and the control base 3 is provided by arranging the local extension 16 within the additional region 5.

Figure 6:
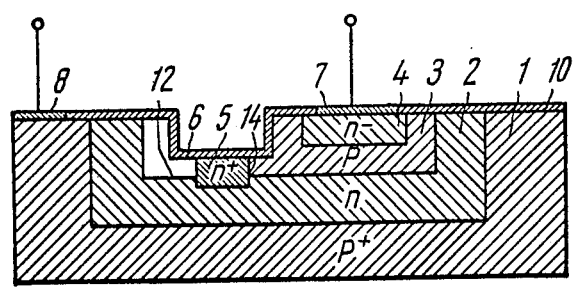
FIG. 6 is similar to FIGS. 1 and 3–5 and shows the structure of a semiconductor switching device having an additional region arranged partially in a wide n-type base.

A semiconductor switching device having high switching voltage can be provided on the basis of the structure shown in FIG. 6. This embodiment is similar to an alternative embodiment of the device shown in FIG. 1, the gate base 3 being provided with a recess 6 arranged at a place where the additional region 5 emerges on the surface. The distance from the recess bottom 6 to the p-n junction 12 formed by the gate base 3 and the wide base 2 of n conductivity type adjacent thereto must, in that case, be shorter than the depth of the additional region 5, which is usually formed simultaneously with the emitter 4 of n conductivity type by diffusion of an appropriate impurity. The above feature provides for the additional region 5 to extend into the wide base 2 of n conductivity type.

The embodiment of semiconductor switching devices with small values of switching voltages requires formation of recesses of small depth which necessitates a special production process to ensure a depth of the additional region, sufficient for the additional region 2 to extend into the wide base of n conductivity type.

Figure 7:
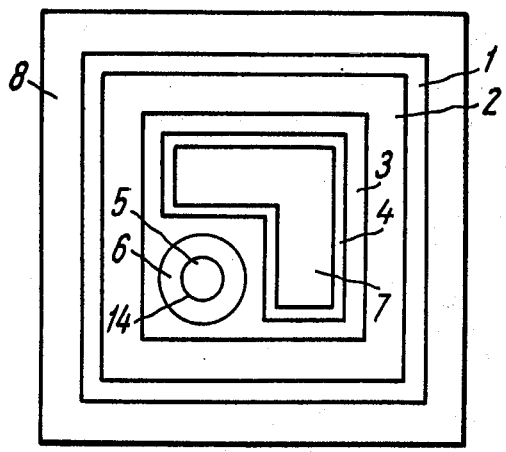
FIG. 7 is a semiconductor switching device shown in FIG. 6, plan view.

FIG. 7 shows a plan view of a semiconductor switching device according to FIG. 6, comprising: the emitter 1 of p conductivity type, the wide base 2 of n-type, the gate base 3, and the n-type emitter 4. The gate base 3 is provided with a roundshaped recess arranged at a place where the additional region 5 extends onto the surface. Metal electrodes 7 and 8 are connected to the emitters 1 and 4 of the semiconductor switching device.

Figure 8:
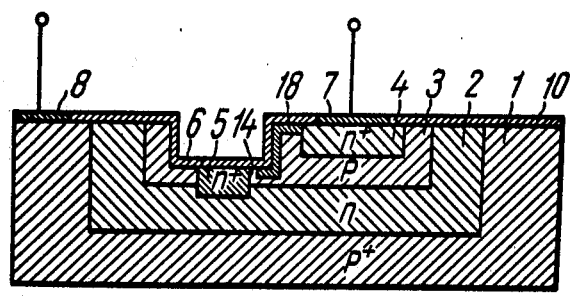
FIG. 8 is similar to FIGS. 1 and 3–6 and shows the structure of a semiconductor switching device having two additional regions.

FIG. 8 shows a schematic view of the structure of a semiconductor switching device having, as distinct from the structure shown in FIG. 6, a second additional region 18 arranged on the surface of the gate base 3 and having the same conductivity type as the base 3, the impurity concentration of the region being higher than that of the base 3 by at least one order of magnitude. This additional region 18 is arranged adjacent to the surface of the emitter 4 (in certain cases it may overlap with a part of the emitter 4), the distance between the additional region 18 and the additional region 5 exceeding the size of the depleted region of the p-n junction 14 formed by the additional region 5 and the gate base 3. The second additional region 18 decreases the dynamic impedance in a region B (FIG. 2) of the voltage-current characteristic when the semiconductor switching device from is changed the cut-off state A to the conducting state D, which reduces of the switching voltage spread, especially when the devices have rather high values of switching-on currents.

Figure 9:
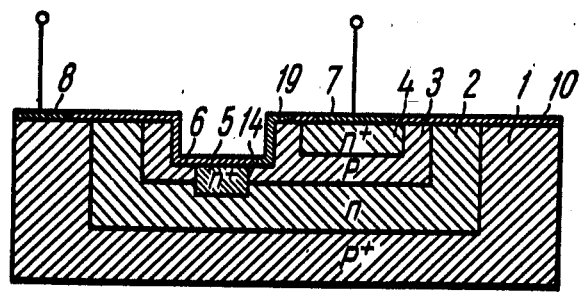
FIG. 9 is similar to FIGS. 1, 3–6 and 8 and shows the structure of a semiconductor switching device having a local layer of a conducting material on the surface of a control base.

FIG. 9 shows the structure of a semiconductor switching device having, as distinct from the structure shown in FIG. 6, a local layer 19 of a conducting material, for example of a metal — silicide alloy, comprising 8–10% Ni — 30–40%, Cr- 50–60% Si, which is disposed on the surface of the control base 3 between the emitter 4 and the additional region 5.

Besides the advantages indicated in respect to the semi-conductor switching device shown in FIG. 8, the above structure allows for variation of the switching voltage temperature coefficient. The above material is characterized by a given value and negative sign of the temperature coefficient of resistance thereof, is coated on the surface as the current-conducting layer 19 to provide for this variation.

Figure 10:
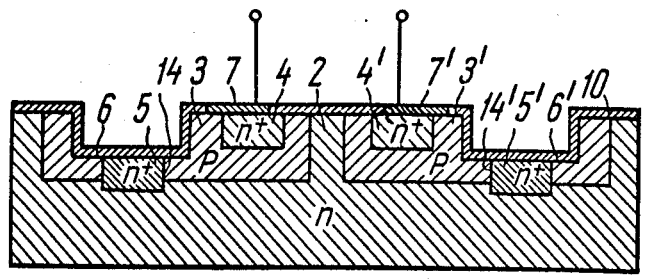
FIG. 10 is similar to FIGS. 1, 3–6 and 8–9 and shows the structure of a bipolar semiconductor switching device having a symmetric voltage-current characteristic.
Figure 11:
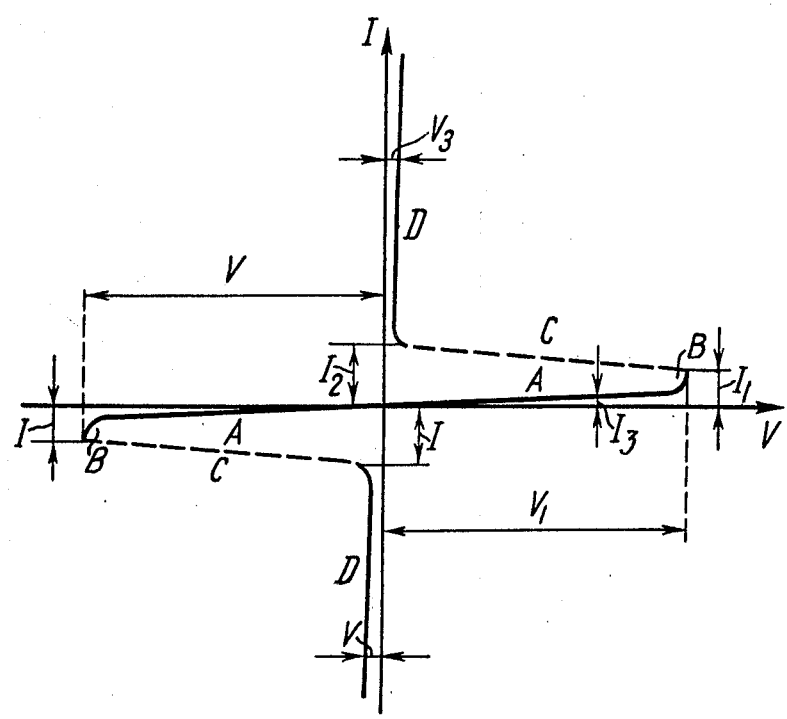
FIG. 11 is the voltage-current characteristic of a bi-polar semiconductor switching device shown in FIG. 10.

FIG. 10 shows the structure of a semiconductor switching device switchable from a low conductivity state to a high conductivity state by a voltage of any polarity applied to its electrodes 7 and 7', the value of the applied voltage being higher than that of the switching voltage of the device. As distinct from the structure of the device shown in FIG. 6, in the wide base 2 of n-type besides the gate base 3, comprising the additional region 5 of conductivity type opposite to said gate base adjacent to the surface thereof, the recess 6, arranged at a surface part where the additional region 5 emerges on the surface, and the emitter 4 of n conductivity type, there is provided a second gate base 3' having an n-emitter 4', an additional region 5' and a recess 6', arranged in this gate base 3' as specified above. The metal electrodes 7 and 7' are made so as to ensure electric connection of the gate bases 3 and 3' with the emitters 4 and 4', respectively. The distance between the gate bases 3 and 3' is selected to ensure a sufficiently high gain of the lateral transistor p-n-p type comprising the layers 3 - 2 - 3', and to ensure the required electrical parameters of the structure of the whole semi-conductor switching device. FIG. 11 shows a voltage-current characteristic I = F(V) of a semiconductor switching device the structure of which is shown in FIG. 10. The symbols of the electrical parameters and of the regions of the voltage-current characteristic are similar to those in FIG. 2.

The semiconductor switching device operates as follows.

The principle of operation of the semiconductor switching device is illustrated on operation of the structure shown in FIG. 1. A voltage of positive polarity with respect to the anode electrode 8 is applied to the metallized electrodes 8 and 7 of the device, that form ohmic contact with the emitter 1 of p conductivity type and with the emitter 4 of n conductivity type, which emitters are the anode electrode and the cathode electrode of the device, respectively. Under the effect of this voltage, the p-n junction 11, formed by the gate base 3 and by the emitter 4 of the device, and the p-n junction 13 formed by the emitter 1 and by the wide base 2 adjacent to the emitter 1 are forward-biased. The p-n junction 12, formed by the bases 2 and 3 of the device, is reverse-biased. If the voltage applied to the electrodes 8 and 7 does not exceed the value of the breakdown voltage of the p-n junction 12 and of the p-n junction 14, formed by the additional region 5 and the control base 3 of the device, an electric current will start flowing through the semiconductor switching device along the following circuit: the anode electrode 8, the emitter 1, the p-n junction 13, the n-type base 2, the p-n junction 12, the control base 3, the p-n junction 11, the n-emitter and the cathode electrode 7, this current being basically equal to the $I_3$ leakage current of the reverse-biased p-n junction 12 (see region A of the voltage-current characteristic shown in FIG. 2).

The increase of the applied voltage up to the value of the breakdown voltage of the p-n junction 14 formed by the additional n-type region 5 and by the gate p-type base 3, results in an avalanche rise of electric current flowing through the electrodes 7 and 8 of the device owing to breakdown of this p-n junction 14 (see region B of the voltage-current characteristic shown in FIG. 2). The current flows from the anode electrode 8, through the p-type emitter 1, the p-n junction 13, the n-type base 2, the current-conducting path 9, the additional region 5, the p-n junction 14, the p-type gate base 3, the p-n junction 11 and the n-type n-emitter 4 to the cathode electrode 7. The increase of the electric current flowing through the semiconductor switching device up to the value at which the sum of the gains of the n-p-n transistor, formed by the layers of the n-type emitter 4, the gate base 3 and the n-type wide base 2, and of the p-n-n transistor formed by the layers of the p-type emitter 1, the wide n-base 2 and the gate base 3, becomes unity (region B of the voltage-current characteristic, current value $I_1$ in FIG. 2), results in switching the device to a high conductivity state. This being the case, the potential across the electrodes 8 and 7 of the device drops to the residual voltage level (region D, value $V_3$ in FIG. 2) and the current flows through the device from the electrode 8 accordingly through the $p$-type emitter 1, the wide base 2, the gate base 3, and the $n$-type emitter 4 to the electrode 7.

The operating principle of a semiconductor switching device the structure of which is shown in FIGS. 3, 4 and 6 is similar to the above described, except for when the device is switched on, the current flows from the anode electrode 8 to the cathode electrode 7 through the $p$-type emitter 1, the wide $n$-type base 2, the additional region 5, and the $n$-type emitter 4. A potential being applied to the electrodes 7 and 8, the switching-on electric current of the semiconductor switching device the structure of which is shown in FIG. 5, flows from the anode electrode 8 through the $p$-type emitter 1, the wide $n$-type base 2 along the jumper 17 to the additional region 5 and further on through the $p$-$n$ junction 14, the gate base 3 and the $n$-type emitter 4 to the cathode electrode 7.

Once a voltage is applied to the semiconductor switching devices, as shown in FIG. 8 and FIG. 9, which results in the breakdown of the $p$-$n$ junction 14 the switching-on current is flowing mainly along the second additional region 18 (FIG. 8), or along the conducting local layer 19 (FIG.9). Due to the fact that the D.C. resistance of the layers of the additional region 18 and that of the local layer 9 is much lower than that of the gate base 3, this being the case particularly in respect to the bottom of recess 6, the dynamic impedance in the switching-on region of the voltage-current characteristic decreases substantially (see FIG. 2). Owing to the fact that the layer 19 (FIG. 9) is made of a material having a negative temperature coefficient of resistance, plus the compensating effect rendered by the forward-biased $p$-$n$ junctions 11 and 13, having a total temperature coefficient of voltage in the order of $(3 - 4)$ mV/°C for silicon $p$-$n$ junctions, the positive temperature coefficient of the breakdown voltage of the $p$-$n$ junction 14 can be compensated in part or completely.

If an A.C. voltage higher than the switching voltage is applied to the electrodes 7 and 7' of the semiconductor switching device shown in FIG. 10, the device is switched from the out-off state to conducting state, in the forward and reverse directions, i.e., it has a symmetrical voltage-current characteristic. For example, when the electrode 7 carries a signal of positive polarity, in respect to the electrode 7; which is increasing in time up to a certain value equal to switching voltage, the device is turned off and only a leakage current is flowing through the electrodes 7 and 7'. The increase of the voltage, applied to the electrodes 7 and 7' of the device, up to the value of the breakdown voltage of the $p$-$n$ junction 14 formed by the additional base 5 and the gate base 3, provides for the current flow from the electrode 7 through the base 3, which in this case acts as a $p$-type emitter of the switching device, through the wide $n$-type base 2 and the gate base 3' to the electrode 7'. The increase of the value of current flowing through the device up to that of the switching-on current, switches the device to the conducting state, and the voltage applied to the electrodes 7 and 7' drops down to the residual voltage. The process of switching the device from a non-conducting to the conducting state by applying a voltage of positive polarity to the electrode 7' is similar to the above procedure. In this case, the gate base 3' functions in fact as the $p$-type emitter of the device. The breakdown of the $p$-$n$ junction 14 provides for the flow of avalanche swelling current through the device.

The method of making the semiconductor switching device according to the invention is illustrated by the example of producing said device from silicon.

In particular, the method of making a semiconductor switching device the structure of which is shown in FIG. 1, is as follows.

Silicon wafers of $p$-type initial conductivity, with the impurity concentration of about $10^{19}$ cm$^{-3}$, are polished first mechanically, than chemically to remove products of previous runs, after which an epitaxial layer of monocrystalline $n$-type silicon 30 - 35$\mu$ thick, with impurity concentration of about $10^{15}$ cm$^{-3}$, is grown on the working surface of the wafers in any known manner, for example, using epitaxial growth by reduction of silicon tetrachloride.

A silicon oxide film not less than 0.6 micron thick is othen grown on the surface of the wafers by thermal oxidation at temperature $T = 1240°$ C, the oxidation process being maintained during 2 hours in an atmosphere of humid oxygen.

For producing the layer of the gate base 3 the oxide film must be provided with windows, which are etched out in the film by methods of photolithography. The process of doping the surface layer of the semiconductor wafer with boron is carried out at $T = 950°$ C during 30 minutes. After chemical removal of the boron-silicate glass formed on the surface of the wafer, the impurity is diffused in an atmosphere of humid oxygene during 2 hours. Besides boron, other diffusants providing for $p$-type conductivity and also other methods of and conditions doping and diffusion impurities can be used. The impurity concentration on the surface of the formed layer is within the range of $10^{17} - 10^{19}$ cm$^{-3}$. The depth of the $p$-$n$ junction is from 12 to 7-8$\mu$ the surface concentration of the impurity is within the range of $10^{17}$  $5.10^{18}$ cm$^{-3}$. After this procedure the recess 6 having required depth is provided by a chemical process on the surface of the formed gate base 3 of $p$ conductivity type. A layer of silicon oxide not less than 0.2 microns is deposited, or thermally grown on the surface of the recess 6. After etching out windows in the oxide film to form the $n^+$-type emitter 4 and the additional region 5, the wafers are subjected to ionic bombardment to dope the wafer with an $n$-type impurity. The photoresistlayer serving as a mask during the process of photolithography, carried out to form windows in the oxide coating, also provides masking during the ionic doping. When using other methods of doping a wafer with an impurity through the surface layer, the wafer must be protected with a silicon oxide film deep enough to ensure masking.

Other materials, for example, silicon nitride films can be used for protective coating.

The formation of the $n$-type emitter 4 and of the additional region 5 is the result of diffusion of phosphorus in oxidising atmosphere at temperature $T = 1100°$ C during 2 hours. The impurity concentration on the surface of these layers is about $10^{20}$ cm$^{-3}$, the depth being about 3$\mu$.

After etching out contact windows and after vacuum deposition of aluminium, the aluminium film is photo-etched and treated in neutral atmosphere to form the electrodes 7, 8 of the device and the current-conducting path 9.

The process of making semiconductor switching devices the structures of which are shown in FIGS. 3, 4, 5, 6, 7, 8, 9, 10 is similar to the one described for the device shown in FIG. I with a few exceptions, described below for each figure, whenever required.

In manufacturing a semiconductor switching device shown in FIG. 3, the recess 6 and the additional region 5 are formed at a surface part where the central p-n junction 12 emerges onto the surface of the semiconductor crystal.

The manufacturing steps for the device of FIG. 4 differs from the processes described above, (FIGS. 1 and 3) in that after making the recess 6 and after applying a silicon oxide protective layer on the crystal surface, there is provided second recess 15, whereas the diffusion of the impurity for forming the n-type emitter 4 and the additional region 5 is carried out from vapour phase.

In the process of producing the semiconductor switching device of FIG. 5, while of photoetching the oxide film is required to form the layer of the control base 3, provision should be made of a protective silicon oxide layer disposed at a place where the additional region 5 is subsequently formed, this layer masking the surface of the crystal to from the effect of the impurity during manufacture of the layer of the control base 3. The minimum thickness of this oxide layer should be at least two times that of layer of the gate base 3. In this case, the central p-n junction 12 has the extension 16 with the jumper 17 to under the additional region 5.

In manufacturing the semiconductor switching device of FIG. 8, the second additional region 18 is formed by the boron diffusion under conditions indicated in the description of the production technology for the device of FIG. 1.

A peculiar feature of the process of production of the semiconductor switching device of FIG. 9 is that the conducting layer 19 made of a material having a negative value of the temperature coefficient of resistance is applied by vacuum deposition onto the surface of the control base. This layer is deposited after making the emitter electrodes 7 and 8.

A distinctive feature of the process of production of the semiconductor switching device of FIG. 10 is formation of a technological shunt having an assigned electrical resistance to direct current, i.e., electrical connection between the n-type emitters 4 and 4' and the control bases 3 and 3', respectively, which is provided in the course of forming the electrodes 7 and 7' of a device.

A more clear understanding of the nature of the invention will be had from the following electrophysical characteristics and geometrical dimensions of the layers of the silicon switchiang device embodied on the basis of the structure of FIG. 5, wherein:

impurity concentration in the $p^+$-type emitter 1- — $5.10^{18}$ cm$^{-3}$, impurity concentration in the wide base 2 of n-type adjacent to the $p^+$-emitter —$10^{15}$ cm$^{-3}$, impurity concentration on the surface of the control base 3 — $10^{17}$ cm$^{-3}$, concentration of the impurity on the surface of the $p^+$-type emitter 4 and the additional region 5 — $10^{20}$ cm$^{-3}$ thickness of the $n^+$-type emitter layer 4 — $3.5.10^{-4}$ cm, thickness of the layer of the gate base 3 — $3.8.10^{-4}$ cm, thickness of the layer of the wide base 2–14$\mu$ depth of the recess 6 — $4.5.10^{-4}\mu$.

The electrical parameters of a semiconductor switching device provided with a technological shunt in the n-type p-emitter 4 having the resistance of 250 ohm, at temperature $t = 25°$ C were as follows:

| | |
|---|---|
| switching voltage $V_1$ | - 35 V, |
| switching-on current, $I_1$ | - 1.4 mA, |
| leakage current at $V = \dfrac{V_1}{2}$ | - 0.3 $\mu$A, |
| residual voltage $V_3$ at forward current of 50 mA | - 0.75 V, |
| holding current, $I_2$ | - 3.2 mA, |
| reverse breakdown voltage, $V_2$ | - 140 V, |
| temperature coefficient of switching voltage | -<0.08%/° C. |

What is claimed is:

1. A semiconductor switching device which has a semiconductor crystal comprising: a first base region of a certain conductivity type; a second base region of a conductivity type opposite to said first base region that is disposed in said first base region and extends mainly on one of the basic surfaces of the crystal; a first additional region of the same conductivity type as said first base region disposed in the second region, extending on the same surface; a second additional region of the same conductivity type as said first base region, disposed in the second region at the bottom of a first recess provided in said main surface of the crystal so that it has no contact with lateral walls of the recess, at least a part of said second additional region being disposed in said first base region, adjacent to said second base region, the concentration of the impurity on the surface of said second additional region being higher than that of said first base region, said second additional region and said first base region being of one conductivity type, and a second recess being provided within the bottom of said first recess in the additional region, the lateral walls of said second recess having no contact with the boundaries of said second additional region.

2. A semiconductor switching device which has a semiconductor crystal comprising: a first base region of a certain conductivity type; a second base region of a conductivity type opposite to said first base region that is disposed in said first base region and extends mainly on one of the basic surfaces of the crystal; a first additional region of the same conductivity type as said first base region disposed in the second region, extending on the same surface; a second additional region of the same conductivity type as said first base region, disposed in the second region at the bottom of a first recess provided in said main surface of the crystal so that it has no contact with lateral walls of the recess, at least a part of said second additional region being disposed in said first base region, adjacent to said second base region, the concentration of the impurity on the surface of said second additional region being higher than that of said first base region, said second additional region and said first base region being of one conductivity type; and a third additional region in said second base region adjacent to the surface thereof and having the same conductivity type with the impurity concentration higher than that of said second base region by at least one order of magnitude, said third additional region being spaced from said second additional region at a distance exceeding the size of the depleted region of the p-n junction formed by said second base region and said second additional region, and being adjacent to said first additional region disposed in said second base region.

3. A semiconductor switching device which has a semiconductor crystal comprising: a first base region of a certain conductivity type; a second base region of a conductivity type opposite to said first base region that is disposed in said first base region and extends mainly on one of the basic surfaces of the crystal; a first additional region of the same conductivity type as said first base region disposed in the second region, extending on the same surface; a second additional region of the same conductivity type as said first base region, disposed in the second region at the bottom of a first recess provided in said main surface of the crystal so that it has no contact with lateral walls of the recess, at least a part of said second additional region being disposed in said first base region, adjacent to said second base region, the concentration of the impurity on the surface of said second additional region being higher than that of said first base region, said second additional region and said first base region being of one conductivity type, and having a local layer of a conducting material coated on the surface of said second base region between said first additional region and said second additional region.

4. A semiconductor switching device as claimed in claim 3, wherein said layer of current conducting material is a material having a negative temperature coefficient of resistance.

* * * * *